United States Patent
Wong et al.

(10) Patent No.: US 7,132,847 B1
(45) Date of Patent: Nov. 7, 2006

(54) PROGRAMMABLE SLEW RATE CONTROL FOR DIFFERENTIAL OUTPUT

(75) Inventors: Wilson Wong, San Francisco, CA (US); Sergey Shumarayev, San Leandro, CA (US); Rakesh Patel, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 29 days.

(21) Appl. No.: 10/708,303

(22) Filed: Feb. 24, 2004

(51) Int. Cl.
*H03K 19/003* (2006.01)

(52) U.S. Cl. .......................... 326/29; 326/86; 327/170

(58) Field of Classification Search .................. 326/29, 326/26, 27, 82, 83; 327/170
See application file for complete search history.

(56) References Cited

U.S. PATENT DOCUMENTS

| | | | |
|---|---|---|---|
| 5,066,873 A | 11/1991 | Chan et al. | |
| 5,315,174 A | 5/1994 | Chang et al. | |
| 5,638,007 A | 6/1997 | Sabin | |
| 5,958,026 A | 9/1999 | Goetting et al. | |
| 5,986,489 A | 11/1999 | Raza et al. | |
| 6,020,757 A | 2/2000 | Jenkins, IV | |
| 6,038,386 A | 3/2000 | Jain | |
| 6,154,059 A | 11/2000 | Cheung et al. | |
| 6,184,703 B1 | 2/2001 | Vest et al. | |
| 6,184,708 B1 | 2/2001 | Jenkins, IV | |
| 6,218,858 B1 | 4/2001 | Meonon et al. | |
| 6,229,336 B1 | 5/2001 | Felton et al. | |
| 6,242,941 B1 | 6/2001 | Vest et al. | |
| 6,246,270 B1 | 6/2001 | Wang et al. | |
| 6,256,235 B1 | 7/2001 | Lee | |
| 6,307,414 B1 * | 10/2001 | Hoff ........................... 327/170 |
| 6,411,126 B1 * | 6/2002 | Tinsley et al. ................ 326/83 |
| 6,417,708 B1 * | 7/2002 | Fiedler ....................... 327/170 |
| 6,433,579 B1 | 8/2002 | Wang et al. | |
| 6,836,168 B1 | 12/2004 | Lesea et al. | |
| 6,836,290 B1 | 12/2004 | Chung et al. | |
| 6,870,390 B1 | 3/2005 | Groen et al. | |
| 6,870,399 B1 * | 3/2005 | Ngo et al. .................... 326/82 |
| 2005/0001653 A1 | 1/2005 | Ahmad | |

OTHER PUBLICATIONS

Altera Data Sheet, "Max 7000: Programmable Logic Device Family," Altera Corp., ver. 6.6, Jun. 2003, pp. 1-21.
Altera Data Sheet, "Max 9000: Programmable Logic Device Family," Altera Corp., ver. 6.5, Jun. 2003, pp. 1-46.
Altera Data Sheet, "FLEX 10K: Embedded Programmable Logic Device Family," Altera Corp., ver. 4.2, Jan. 2003, pp. 1-40.
*Cyclone Device Handbook*, vol. 1, Chapter 2, "Cyclone Architecture," Altera Corp., CS1002-1.2, Oct. 2003, pp. 2-1 to 2-56.

* cited by examiner

*Primary Examiner*—James H. Cho
(74) *Attorney, Agent, or Firm*—Townsend and Townsend and Crew, LLP

(57) ABSTRACT

A programmable technique is used to control the slew rate of a differential output buffer. A method controls the slew rate (SR) by changing an "on" resistance of the switches used to steer the current. This can be accomplished by (i) using different size switches or (ii) changing the slew rate of the predrivers which drive the final switches. The latter approach has the advantage that it only temporarily increases the "on" resistance, which does not cause any headroom problems after the transient. A specific application is for the differential outputs of a programmable logic integrated circuits.

19 Claims, 7 Drawing Sheets

PROGRAMMABLE SLEW RATE CONTROL FOR DIFFERENTIAL OUTPUT

BACKGROUND OF INVENTION

The present invention relates to the field of integrated circuits and in particular, to a programmable slew rate control for a differential output of the integrated circuit.

Integrated circuits are important building blocks of the modern age. Technology continues to evolve and integrated circuits continue to provide improved functionality. As integrated circuits improve, so do the electronics systems that are built using integrated circuits. There are many types of integrated circuit such as memories, micro-processors, application specific integrated circuits (ASICs), and programmable logic. Programmable logic integrated circuits such as PALS, PLDS, FPGAS, LCAS, and others are becoming more complex and continually evolving to provide more user-programmable features on a single integrated circuit.

Data is input and output from integrated circuits. Integrated circuits are used in a wide range of applications, some requiring higher performance than other applications. When higher performance is needed, then integrated circuits should output data in order to meet the performance specification. However, when less performance is sufficient, it is desirable that the output of the integrated circuit can be slowed down.

One of the problems that is important to address when using integrated circuits is noise. Integrated circuits generate noise on a printed circuit board when their outputs switch. Noise is undesirable because if the noise is sufficiently great, it may cause incorrect logic to be input or improper clocking of the integrated circuit or other integrated circuits on the printed circuit board. The amount of noise depends on a number of factors including the edge rate of the output signals. Sharper or faster edge rates tend to generate more noise, while slower slew rate signals have less noise. To address noise, printed circuit boards can be designed to handle noise, but generally at greater expense.

Therefore, it is desirable that differential output drivers of an integrated circuit can be programmably controlled to have a slower slew rate, to reduce noise, especially in those situations where high-speed is not needed.

SUMMARY OF INVENTION

The invention is a programmable technique of controlling the slew rate of a differential output buffer. A method controls the slew rate (SR) by changing an "on" resistance of the switches used to steer the current. This can be accomplished by (i) using different size switches or (ii) changing the slew rate of the predrivers which drive the final switches. The latter approach has the advantage that it only temporarily increases the "on" resistance, which does not cause any headroom problems after the transient. A specific application of the invention is for programmable logic integrated circuits.

An aspect of this invention is to satisfy a range of user applications by allowing a programmable method to change the slew rate of a differential output driver (TX). The slew rate is a measure of how quickly an edge transitions from a beginning level to a final level. To meet higher data rates, a higher slew rate is typically needed. Users who do not need to meet a higher data rate or users who do not have heavily attenuated backplanes may not need to have a high slew rate. Higher slew rates result in higher crosstalk and electromagnetic interference (EMI), a huge problem for users.

In an embodiment, the invention is a method of operating an integrated circuit including providing a differential output driver at an output of the integrated circuit, where the differential output driver has a first slew rate mode and a second slew rate mode. The differential output driver is configured to operate in the first or second slew rate mode. When in the first slew rate mode, an input signal having a first edge rate is provided to an input of the differential output driver. When in the second slew rate mode, an input signal having a second edge rate is provided to the input of the differential output driver, where the second edge rate is slower than the first edge rate.

In another embodiment, the invention is a method of operating an integrated circuit including providing a differential output driver at an output of the integrated circuit, where the differential output driver has a first slew rate mode and a second slew rate mode. When in the first slew rate mode, an input of the differential output driver is driven by a predriver outputting a signal from a first voltage level to a second voltage level. When in the second slew rate mode, the input of the differential output driver is driven by the predriver outputting a signal from the first voltage level to a third voltage level, where the third voltage level is less than the second voltage level.

In another embodiment, the invention is an integrated circuit having a differential output driver circuit having an output transistor having a first transistor group having a first on resistance and first control electrodes, a second transistor group having a second on resistance and second control electrodes, and a third transistor group having a third on resistance and third control electrodes, where the first on resistance is less than the second on resistance, which is less than the third on resistance. A first predriver is connected to the first control electrodes. A second predriver is connected to the second control electrodes. A third predriver is connected to the third control electrodes, where at least one of the first, second, or third predriver is enabled to drive the differential output driver.

Alternatively in the above embodiment, the differential output driver circuit may have an output transistor with a first transistor group having a first number of legs and first control electrodes, a second transistor group having a second number of legs and second control electrodes, and a third transistor group having a third number of legs and third control electrodes, where the first number of legs is greater than the second number of legs, which is greater than the third number of legs.

Other objects, features, and advantages of the present invention will become apparent upon consideration of the following detailed description and the accompanying drawings, in which like reference designations represent like features throughout the figures.

DETAILED DESCRIPTION

Figure 1:
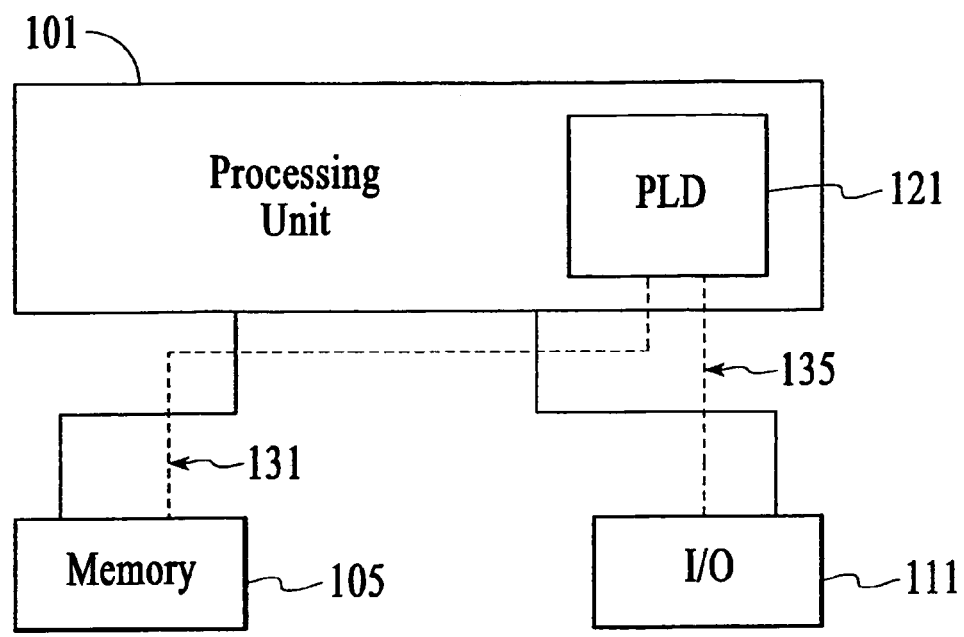
FIG. 1 is diagram of a digital system with a programmable logic integrated circuit.

FIG. 1 shows a block diagram of a digital system, within which input and output interfaces consistent with the present invention may be embodied. The system may be provided on a single board, on multiple boards, or within multiple enclosures. Though embodiments of the present invention are useful in electronic and integrated circuits in general, they are particularly useful in programmable logic devices. FIG. 1 illustrates a system 101 in which such a programmable logic device 121 may be utilized. Programmable logic devices or programmable logic integrated circuits are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. Examples of current programmable logic devices are represented by Altera's Classic, MAX®, FLEX®, APEX™, and STRATIX™ series of PLDs. These are described in, for example, U.S. Pat. Nos. 4,617,479, 4,871,930, 5,241,224, 5,258,668, 5,260,610, 5,260,611, 5,436,575, and the Altera Data Book (2003). Programmable logic integrated circuits and their operation are well known to those of skill in the art.

In the particular embodiment of FIG. 1, a processing unit 101 is connected to a memory 105 and an I/O 111, and incorporates a programmable logic device 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, Internet communications and networking, wireless devices, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, network controller, or other processing unit. Furthermore, in many embodiments, there is often no need for a CPU. For example, instead of a CPU, one or more PLDs 121 may control the logical operations of the system. In an embodiment, PLD 121 acts as a re-configurable processor, which can be reprogrammed as needed to handle a particular computing task.

Alternately, programmable logic device 121 may include a processor. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
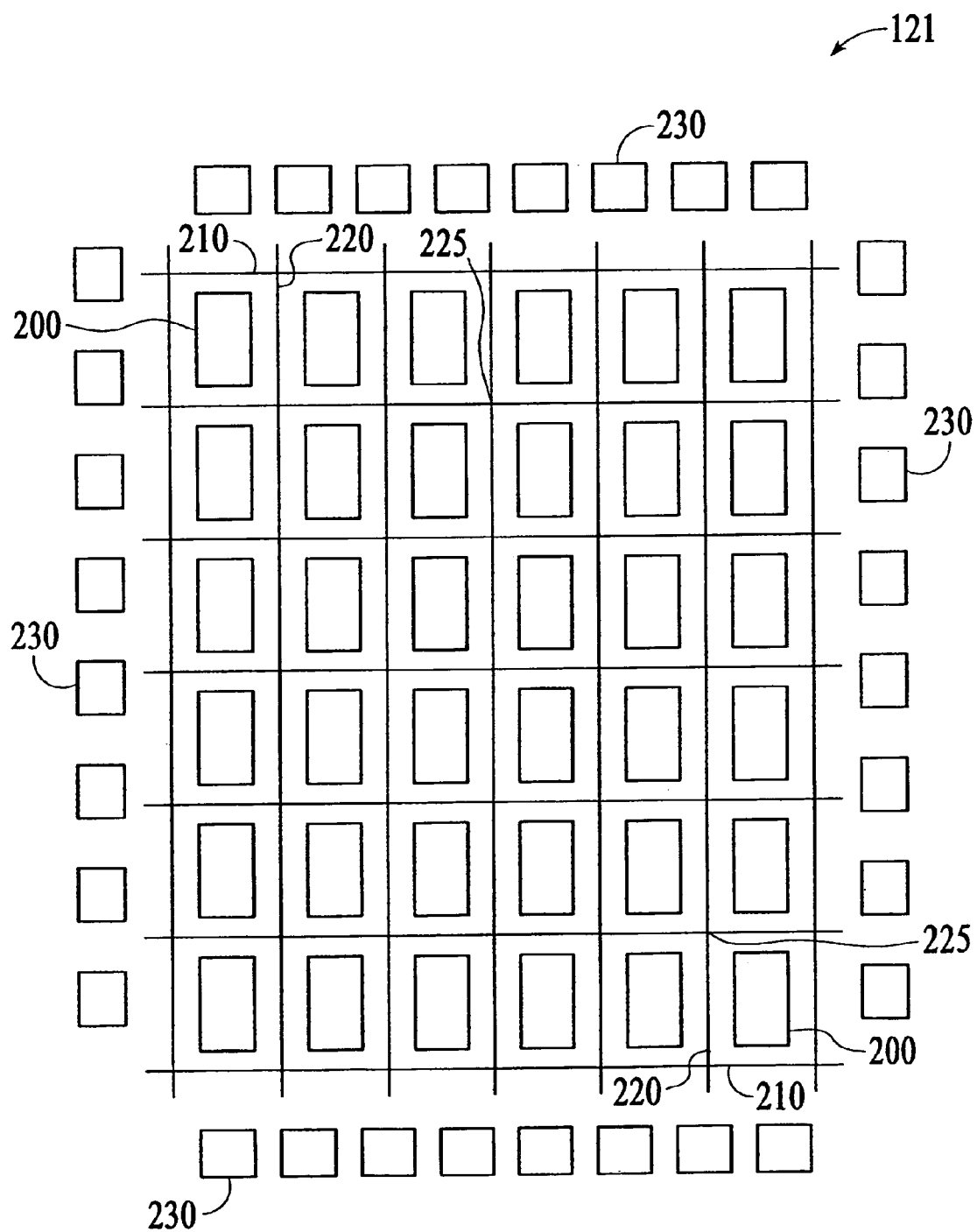
FIG. 2 is a diagram showing an architecture of a programmable logic integrated circuit.

FIG. 2 is a simplified block diagram of an overall internal architecture and organization of a PLD. Many details of programmable logic architecture, organization, and circuit design are not necessary for an understanding of the present invention and such details are not shown.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB is described in more detail below. The programmable logic portion may contain any arbitrary number of LABs. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown), some of which may be consistent with the present invention, and which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location of PLD portion 154 to another LAB 200 at another location of PLD portion 154. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The programmable logic architecture in FIG. 2 further shows at the peripheries of the chip, input and output or I/O circuits 230. Input and output circuits 230 are for interfacing the PLD to external, off-chip circuitry. Some or all of these input and output circuits 230 may be consistent with embodiments of the present invention. FIG. 2 shows thirtytwo input and output circuits 230; however, a programmable logic integrated circuit may contain any number of input and output circuits, more or less than the number depicted. As discussed above, some of these input-output or I/O drivers may be shared between the embedded processor and programmable logic portions. Each input and output circuit 230 is configurable for use as an input driver, output driver, or bidirectional driver. In other embodiments of a programmable logic integrated circuit, the input and output circuits may be embedded with the integrated circuit core itself. This embedded placement of the input and output circuits may be used with flip chip packaging and will minimize the parasitics of routing the signals to input and output circuits.

Figure 3:
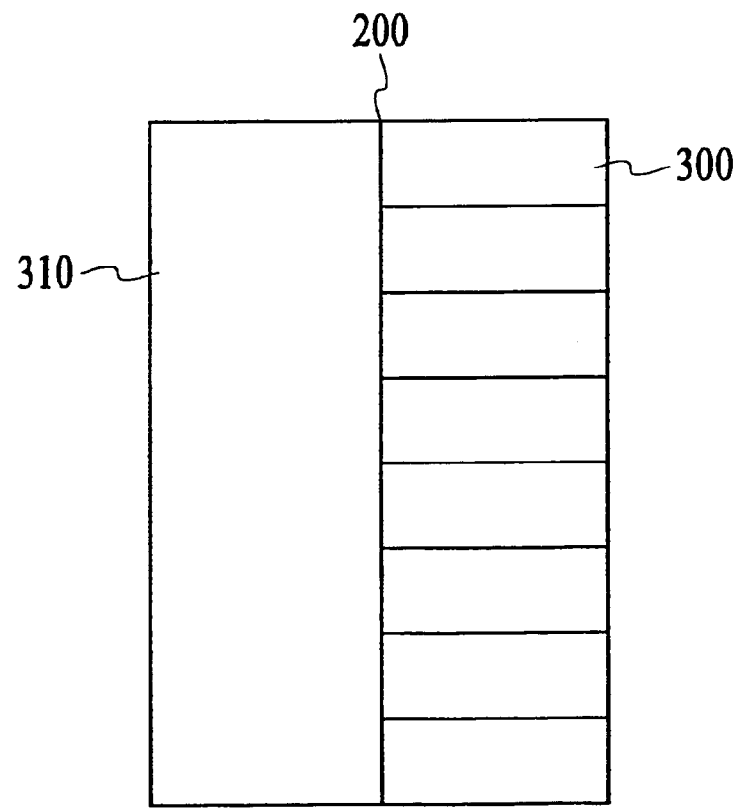
FIG. 3 is a simplified block diagram of a logic array block (LAB).

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 4:
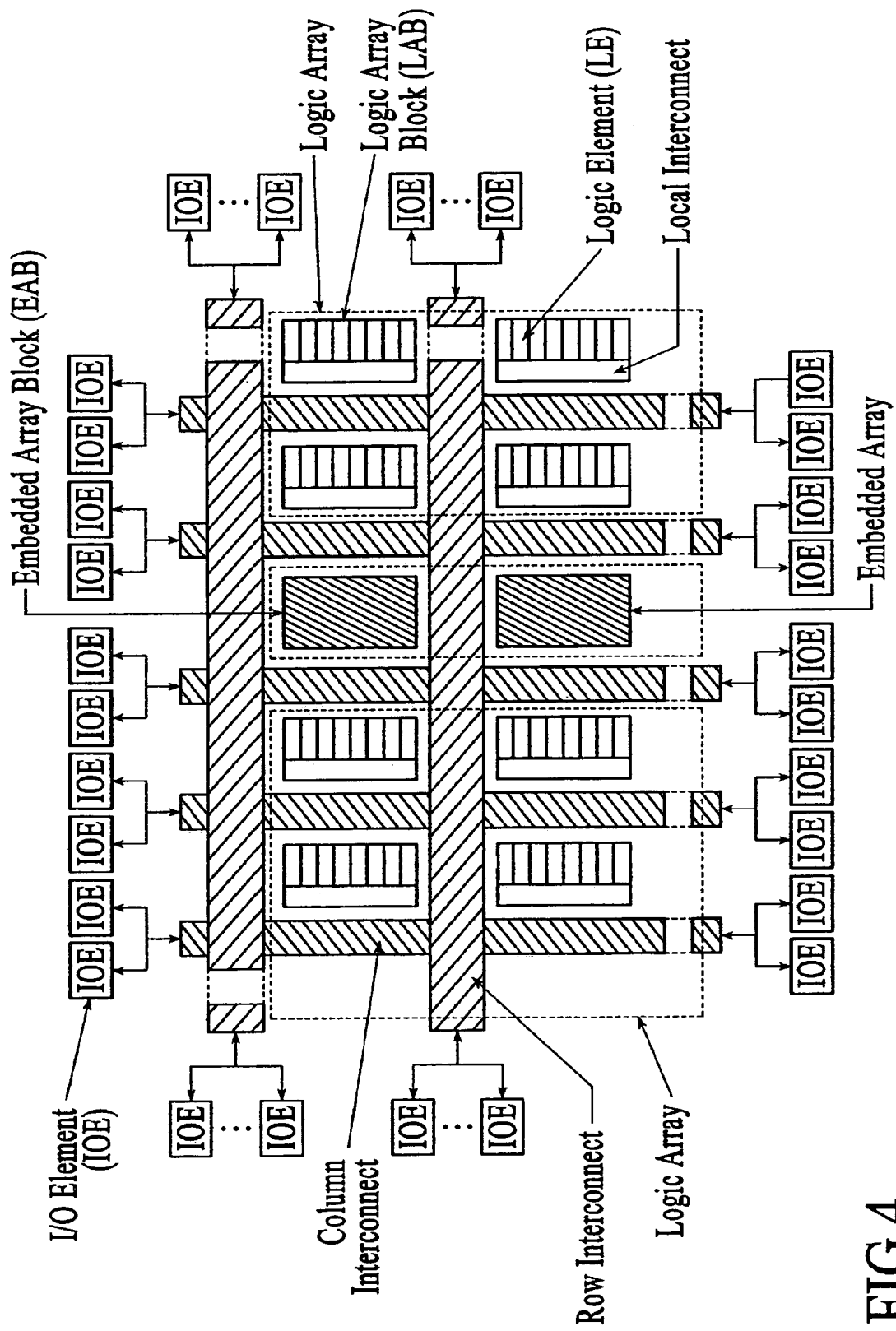
FIG. 4 shows an architecture of a programmable logic integrated circuit with embedded array blocks (EABs).

FIG. 4 shows a programmable logic architecture. The architecture in FIG. 4 further includes (small) embedded array blocks (EABs). EABs contain user memory, a flexible block of RAM. More discussion of this architecture may be found in the Altera Data Book (2003) in the description of the FLEX 10K product family and also in U.S. Pat. No. 5,550,782. Some or all of the input-output or I/O elements may be consistent with embodiments of the present invention. The embedded array blocks can be configured as FIFOs acting as frequency translators and serial to parallel converters for interfacing between high-speed input and outputs and the core circuits including the logic array blocks. Other architectures such as Altera's APEX™ and STRATIX™ family of products are described in detail in the their respective data sheets, available via the Internet at www.altera.com.

Figure 5:
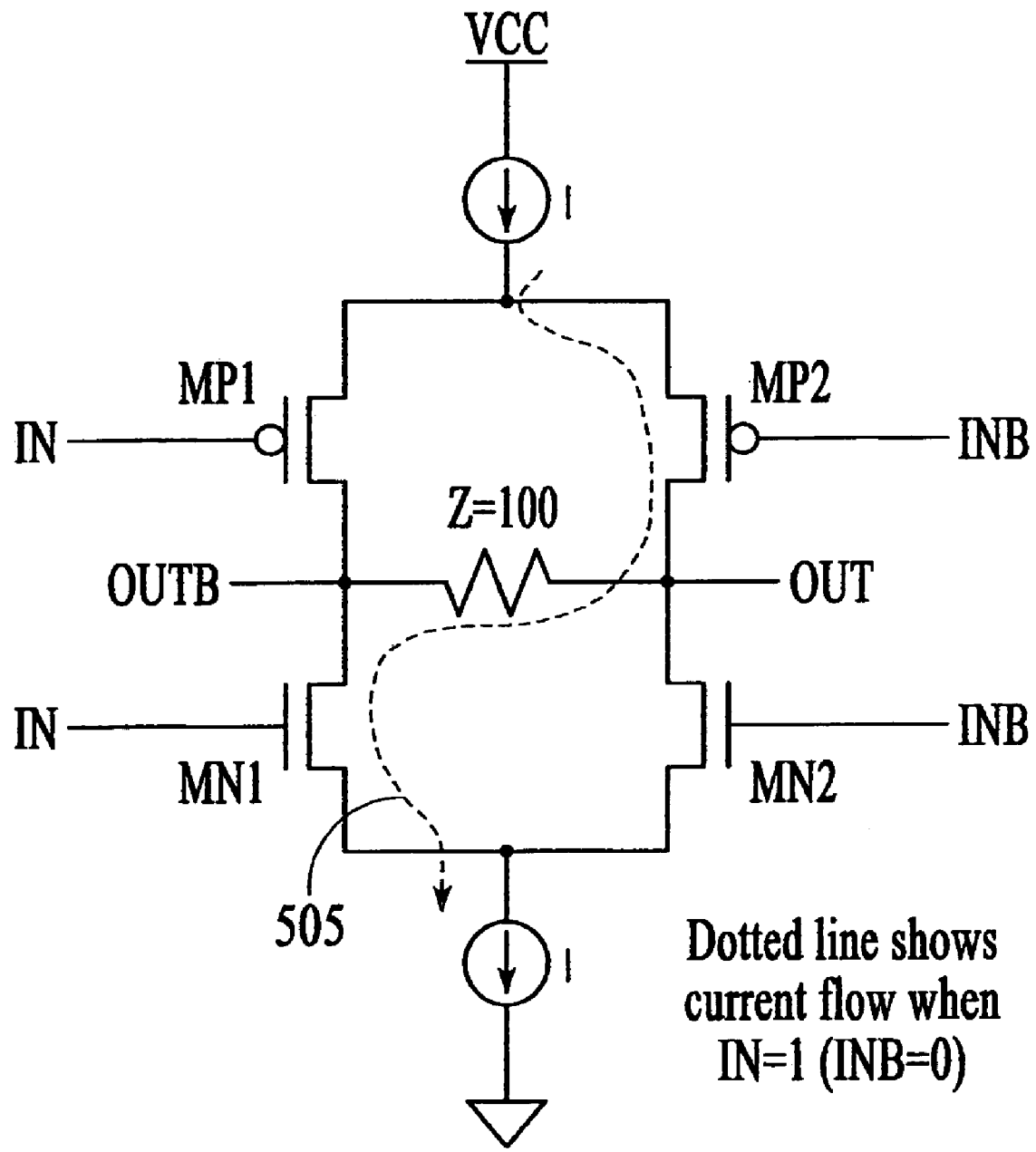
FIG. 5 shows a circuit schematic of a differential output driver.

An integrated circuit such as a programmable logic integrated circuit has output drivers to output data off the integrated circuit. For example, these output drivers may be in the input/output blocks of the programmable logic integrated circuit. FIG. 5 shows a schematic of a differential output driver. An integrated circuit is used in a variety of applications, some applications require higher speed outputs with faster edge or slew rates, while other application require less performance and slower slew rates will be acceptable. Faster slew rates sometimes cause more noise for a printed circuit board, and it may be undesirable to have fast slew rates when they are not needed.

The slew rate is a measure of how quickly an edge transitions from a beginning level to a final level. The units for slew rate are volts per second or time unit. To meet higher data rates, a higher slew rate is required. Users who do not need to meet a higher data rate or customers who do not have heavily attenuated backplanes may not need to have a high slew rate. Higher slew rates result in higher crosstalk and electromagnetic interference (EMI). There are different ways to measure slew rate. For example, sometimes slew rate is measured from the 20 percent to 80 percent points of the edge. Sometimes slew rate is measured from the 10 percent to 90 percent points as an example.

The invention provides a programmable slew rate differential output driver that will satisfy a range of user applications by allowing a programmable method to change the slew rate of a differential output driver (TX). A programmable means to control the slew rate will be described as a specific embodiment. For example, the differential output driver may be configured to have one of a number slew rates.

In a specific embodiment, the differential output driver has a first slew rate mode and a second slew rate mode, where the second slew rate mode has a slower edge rate than the second. The differential output driver of the invention may have more than two different slew rates. For example, there may be a three, four, five, six, four, or more slew rate modes, and each may have a different slew rate. A user selects a specific mode to fine-tune a slew rate of the device to the user's particular application.

Selecting one of the slew rate modes may be accomplished by way of programming programmable memory elements such as EPROM, EEPROM, Flash, SRAM, DRAM, antifuse, flip-flops, or other memory technologies or circuit. For example, a user may store a 0 in an SRAM cell to specify a first slew rate mode and a 1 to specify a second slew rate mode. The SRAM cell may be substituted with a Flash cell for nonvolatile storage. The SRAM cell may be connected to a control circuit block that connects to the output driver to control its operation. In an embodiment, the slew rate mode of the output driver may be changed during operation, such as by changing the contents of the SRAM cell.

Another technique for configuring the output driver slew rate mode may be to use a logic or control signal, such as provided externally by a user or from the programmable logic of the device. Such a signal may be dynamically changed during the operation of the device, so the slew rate of the device may be changed more quickly or easily depending on the situation.

A method to control the slew rate (SR) changes the "on" resistance of the switches used to steer the current. This can be accomplished by using different size switches or changing the slew rate of predrivers driving the final switches. Either approach will work, but the latter approach has an advantage in that it only temporarily increases the "on" resistance. This doesn't cause any headroom problems after the transient.

FIG. 5 shows a schematic of a differential output driver. MN1, MN2, MP1 and MP2 are the MOS switches that steer the current in the differential output driver. MN1 and MN2 are NMOS devices while MP1 and MP2 are PMOS devices.

If IN is 1 and INB is 0, switches MN1 and MP2 are "on." Current I 505 (indicated by the dashed lines) flows from node OUT to OUTB through the termination resistor Z to form a differential output voltage Vod, which is a value I*Z. The slew rate is determined by how fast we can charge nodes OUT and OUTB. This is determined by any lumped parasitic capacitances as well as any nonideal attenuation or losses, which exists on the transmission medium. These include on chip-metallization, skin effects, vias, connectors, and other factors.

When IN is 0 and INB is 1, OUT will be 0 and OUTB will be a 1, which is an analogous situation to what is described above for IN of 1 and INB of 0, except the current path through MP1, from OUTB to OUT, and through MN2. These conditions illustrate the two output states of the differential output driver.

A resistor or additional resistance may be added along the current path shown in FIG. 5 to reduce the slew rate. This can be accomplished by either inserting a programmable resistance in series or taking advantage of the existing switches MN1, MN2, MP1 and MP2. By increasing the resistance or impedance of the current path, this slows down the edge rate. The current is reduced and the time, which is an RC delay, needed to charge the load capacitances and parasitic capacitances increases.

According to a first technique of the invention, we can take advantage of the existing switches and change its "on" resistance value by slowing the edges of the signal input at IN and INB. This is because the transistors are not perfect switches, which have zero resistance. In reality the resistance of the transistors changes as a function of its gate voltage. This is shown plotted in FIG. 6 for an NMOS. Of course the curve will vary depending on the size of the transistor. This graph shows the resistance of the transistor increases significantly as the gate voltage gets closer to 0.5 volts. Keeping the transistors in this higher resistance portion of the curve will slow down the slew rate of the differential output driver.

Figure 7:
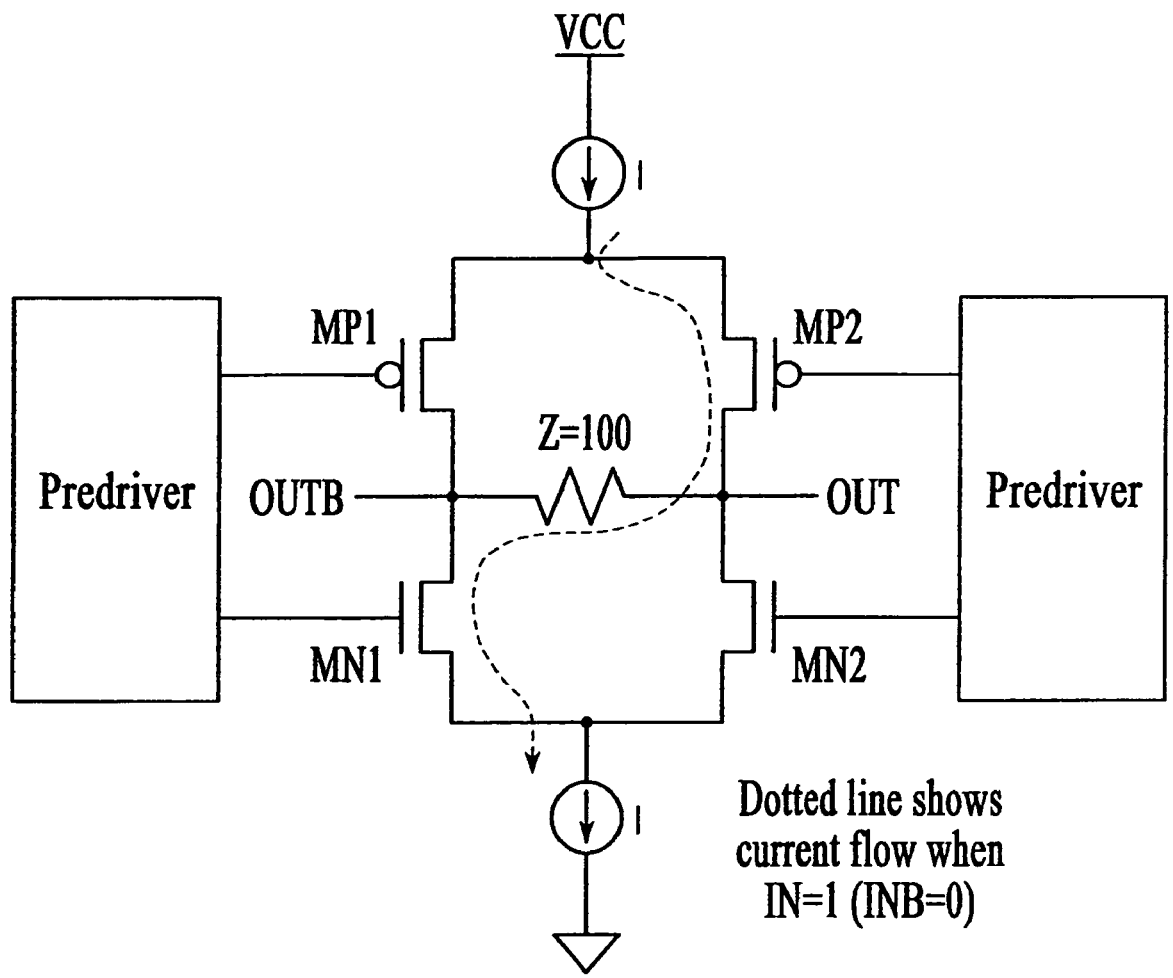
FIG. 7 shows a circuit schematic of a differential output driver with predriver circuit blocks.

Thus, by slowing the edge of the signal driving IN and INB, we are able to traverse the resistance curve slower, resulting in a higher average resistance for the transistor. This will lead to a slower edge rate at the OUT and OUTB nodes since the resistance will limit how quickly the OUT and OUTB nodes are charged. There are many programmable methods to slow an edge, the details of which will not be discussed here. For example, FIG. 7 shows the output driver being driven by predriver circuits. The predriver circuitry will include circuitry to reduce the slew rate of the signals provided at IN and INB. Furthermore, any techniques used to slow the edge of the signals to IN and INB may be used.

The approach would be programmable, so the edge rate of input signal provided by the predriver may slowed when it is desirable to reduce the slew rate of the output driver, but left at its standard edge rate when a faster slew rate for the output driver is desirable. For example, according to one technique, a programmable bit such as a SRAM, EEPROM, EPROM, or Flash cell indicates whether the slew rate is to be slow or fast, and this bit is used to control or adjust the operation of the predriver circuits appropriately. In other embodiments. The bit may be stored using a flip flop or register. Each individual differential output driver may have a separate slew rate control bit, which means each differential output driver may be individually controlled. The table below summarizes the operation of a programmable slew rate bit.

TABLE

| Slew Rate Bit | Differential Output Driver |
|---|---|
| Mode 0 | Normal |
| Mode 1 | Slower Slew Rate Mode |

An advantage of this approach is that once the switches are fully "on," the output driver transistors will have the minimum resistance value. Thus, this can allow design of a switch that has a very small voltage drop across it when signals IN and INB reach their final values. Only during the transient does the switch exhibit a larger voltage drop across it, which is a desired condition to slow the edge rate at the output.

Typically, in operation, the signals driving IN and INB of the differential output buffer are full-rail signals starting from about 0 volts and switching to about VCC, and vice versa. For a slower edge rate transition or reduced slew rate signal, the time taken for the switch from 0 to VCC, or vice versa, will be longer for a normal edge transition. For example, the IN signal may switch between 0 to VCC volts in about 50 picoseconds in the normal case, and may take 500 picosecond in the reduced slew rate case. These numbers are provided as example only and the actual switching times will depend on many factors including the circuit design and process technology.

Figure 6:
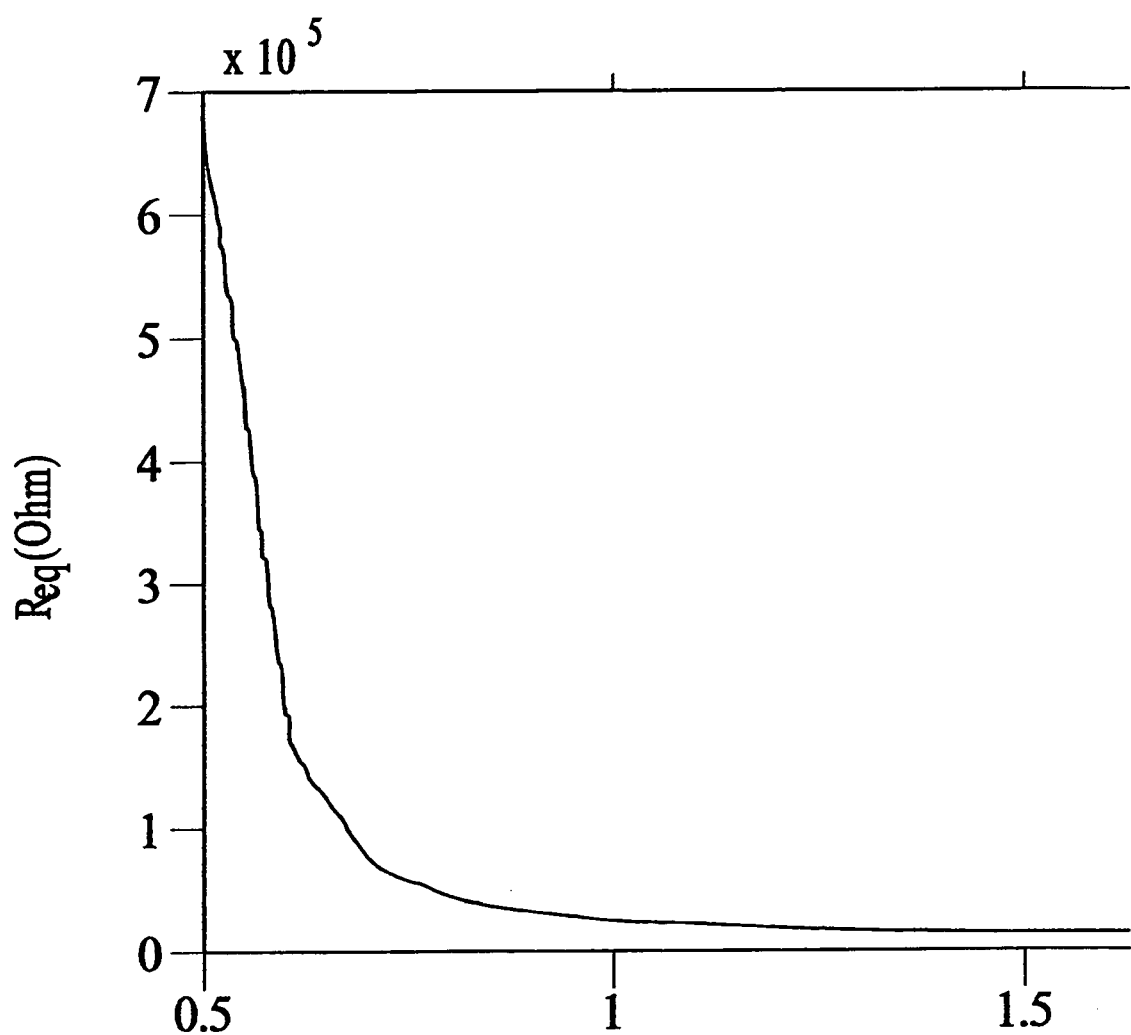
FIG. 6 shows an example of a resistance curve for an NMOS switch.

According to a second technique of the invention, improving on the first approach, we see from FIG. 6 that the region of effective "Ron" modulation is limited. In the example given in FIG. 6 we see that above about 1 volt the Ron seems to saturate near the lowest value. Thus, a predriver, such as shown in FIG. 7, is designed to have a limited swing. For example, in the case of this specific NMOS we can use perhaps a swing from 0 to 1 volts for the slower slew rate mode, while the swing may be from 0 to 1.5 volts or another voltage level greater than 1 volt. In general the swing can be limited from Vlow to Vhigh, where these numbers are arbitrary and are determined by the Ron curve based on the type of transistor and process technology used. Typically Vlow will be the same for both the normal mode and the slower slew rate mode, and Vhigh in the slower slew rate mode will be less than Vhigh in the normal mode. However, the values for Vlow and Vhigh will vary depending on the specific design, transistors, and process technology. Generally, when in the slower slew rate mode, the total voltage swing for the predriver will be less than the voltage swing in the normal slew rate mode.

Furthermore, in an implementation, Vlow and Vhigh are programmable, either by a user or set at the factory by the integrated circuit manufacturer. This implementation of limiting the swing can allow the predriver to run at the highest rate of operation, unlike the first approach above. The first approach provides that the predriver have a slow enough slew rate to give an effectively higher Ron.

In a third approach, parallel switches or transistors maybe added to the main switches. This can allow the user a programmable option to select the amount of "on" resistance the switch will have, thereby selecting the desirable output slew rate. This is illustrated for one switch in FIG. 8.

Figure 8:
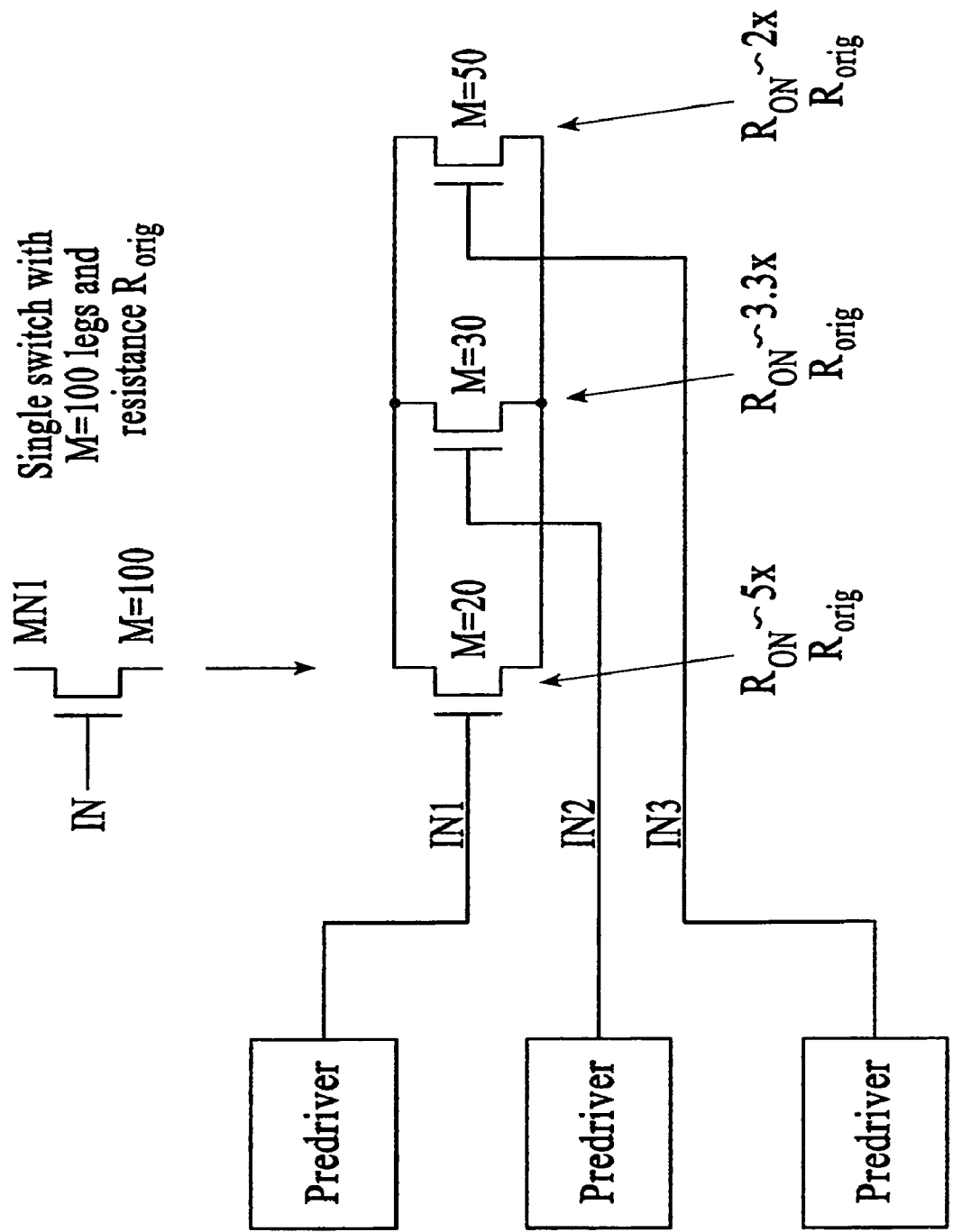
FIG. 8 shows an example of an NMOS driver being implemented using a number of different switches.

FIG. 8 shows how a transistor with 100 legs (i.e., M=100) is divided into transistors with 20, 30, and 50 legs. The figure shows transistor MN1, but the same technique may also be applied to other transistors including MN2, MP1, and MP2. Each transistor or switch is connected to a different input signal, IN1, IN2, and IN3. IN1, IN2, and IN3 drive the control electrodes or gates of the devices. Having more legs generally means a device will has less on resistance. For example, with 100 legs, the on resistance is much less than for 50 legs (i.e., M=50), which is less than 30 legs (i.e., M=30), which is less then 20 legs (i.e., M=20). The numbers selected in FIG. 8 are for illustration purposes only. A transistor or switch may have any number of legs, and it can broken into any number of smaller transistors have any number of legs. Three transistors are shown, but there may be 2, 4, 5, 6, 7, 8, 9, or more transistors.

In operation, IN1, IN2 and IN3 can be encoded to give different values of "on" resistance Ron. In FIG. 8, for example, Ron can be chosen to be about 5× the original value by only enabling IN1 and shutting off the other transistors. Ron can be chosen to be about 3.3× the original value by only enabling IN2 and shutting off the other transistors. Ron can be chosen to be about 2× the original value by only enabling IN3 and shutting off the other transistors.

Furthermore, different combinations of the three switches can be enabled giving values of Ron from 5× to 1× the original value. For example, IN1 and IN2 may be enabled to provide an Ron of 2× the original value (50 legs total enabled). IN1 and IN3 may be enabled to provide an Ron of 1.43× the original value (70 legs total enabled). IN2 and IN2 may be enabled to provide an Ron of 1.25× the original value (80 legs total enabled).

In further embodiments, more switches can be added. The benefit of this approach is that the total size or extra loading added is not much more than the original single unit of M=100. Therefore this approach will not degrade performance too much in the case where the highest speed is required. In other words, a reason the loading is not a lot more is that in an implementation, the maximum size to meet our highest speed requirement is chosen. Then this maximum sized device is "granularized" into smaller pieces to meet the lower edge rates. So, the total loading is still optimal for the highest data rate. Sandbagging, or adding programmability to load down a node to slow down an edge rate, would add unwanted parasitics since each "sandbagging" capacitor needs to have an enable switch. In this approach, there will be less unwanted parasitics.

Programmability of the slew rate for this approach may include a control circuit to select which ones or combinations of the inputs (e.g., IN1, IN2, IN3) to enable. Control may be by way of programmable bits such as SRAM, Flash, or EEPROM, or may be way of logic signals. Furthermore, as discussed above, for this and the other approaches of the invention, programmability can be static or dynamic. A PLD's resources can be used to dynamically affect the slew rate in the form of a soft or hard IP. Complex algorithms can be programmed into a PLD to control the slew rate. An example may be an algorithm that samples the error rate and increase or reduce the slew rate to get an optimum value. For example, the slew rate of the differential output driver will be reduced until the error rate is zero.

Furthermore, any of the above approaches may be combined to achieve a variation of slew rate control. For example, for the slower slew rate mode of the output driver, a predriver may provide both a slower slew rate signal input and reduced voltage swing. Also, the transistors may be divided into groupings of devices with fewer legs. The above approaches may be combined in any way, and may in combination provide additional or improved slew rate control compared to using one technique individually.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method of operating an integrated circuit comprising:
providing a differential output driver at an output of the integrated circuit, wherein the differential output driver has a first slew rate mode and a second slew rate mode;
configuring the differential output driver to operate in the first or second slew rate mode;
when in the first slew rate mode, providing an input signal having a first edge rate to an input of the differential output driver; and
when in the second slew rate mode, providing an input signal having a second edge rate to the input of the differential output driver, wherein the second edge rate is slower than the first edge rate,
wherein when the differential output driver is in the second slew rate mode, the input signal driving the differential output driver has voltage swing of X volts, which is less than a voltage swing of the input signal when the differential output driver is in the first slew rate mode.

2. The method of claim 1 wherein the differential output driver comprises a plurality of NMOS transistors, each of the plurality having a different number of legs and a separate gate input, and the input signal is coupled to one or more of the separate gate inputs of the plurality of NMOS transistors.

3. The method of claim 1 wherein the integrated circuit is a programmable logic integrated circuit.

4. The method of claim 1 wherein configuring the differential output driver to operate in the first or second slew rate mode comprises programming an SRAM memory cell, EPROM memory cell, EEPROM memory cell, or Flash memory cell.

5. A method of operating an integrated circuit comprising:
providing a differential output driver at an output of the integrated circuit, wherein the differential output driver has a first slew rate mode and a second slew rate mode;
configuring the differential output driver to operate in the first or second slew rate mode;
when in the first slew rate mode, providing an input signal having a first edge rate to an input of the differential output driver; and
when in the second slew rate mode, providing an input signal having a second edge rate to the input of the differential output driver, wherein the second edge rate is slower than the first edge rate;
wherein the differential output driver comprises:
a first PMOS transistor coupled between a first supply line and a first output node of the differential output driver;
a first NMOS transistor coupled between the first output node and a second supply line;
a second PMOS transistor coupled between the first supply line and second output node of the differential output driver;
a second NMOS transistor coupled between the second output node and the second supply line; and
an impedance device coupled between the first and second output node.

6. The method of claim 5 wherein the input signal is coupled to gates of the first PMOS and first NMOS transistors, and an inverted input signal is coupled to gates of the second PMOS and second NMOS transistors.

7. The method of claim 6 wherein when the input signal has the second edge rate slower than the first edge rate, the inverted input signal has a third edge rate, slower than a fourth edge rate of the inverted input signal during the first slew rate mode.

8. A method of operating an integrated circuit comprising:
providing a differential output driver at an output of the integrated circuit, wherein the differential output driver has a first slew rate mode and a second slew rate mode;
when in the first slew rate mode, driving an input of the differential output driver with a predriver outputting a signal from a first voltage level to a second voltage level; and
when in the second slew rate mode, driving the input of the differential output driver with the predriver outputting a signal from the first voltage level to a third voltage level, where the third voltage level is less than the second voltage level.

9. The method of claim 8 wherein when in the second slew rate mode, an input signal driving the differential output driver has an edge rate of X volts per second, which is less than an edge rate of the input signal when the differential output driver is in the first slew rate mode.

10. The method of claim 8 wherein a first difference between the second and first voltage levels is greater than a second difference between the third and first voltage levels.

11. The method of claim 8 wherein the integrated circuit is a programmable logic integrated circuit.

12. The method of claim 8 wherein the differential output driver comprises a plurality of NMOS transistors, each of the plurality having a different number of legs and a separate gate input, and the input of the differential output driver is coupled to one of more of the separate gate inputs of the plurality of NMOS transistors.

13. An integrated circuit comprising:
a differential output driver circuit comprising an output transistor comprising a first transistor group comprising a first on resistance and first control electrodes, a second transistor group comprising a second on resistance and second control electrodes, and a third transistor group comprising a third on resistance and third control electrodes, wherein the first on resistance is less than the second on resistance, which is less than the third on resistance;
a first predriver coupled to the first control electrodes;
a second predriver coupled to the second control electrodes; and
a third predriver coupled to the third control electrodes, wherein at least one of the first, second, or third predriver is enabled to drive the differential output driver.

14. The integrated circuit of claim 13 wherein at least any two of the first, second, and third predrivers are enabled to drive the differential output driver.

15. The integrated circuit of claim 13 wherein the first, second, and third predrivers are enabled to drive the differential output driver.

16. The integrated circuit of claim 13 wherein the integrated circuit is a programmable logic integrated circuit.

17. An integrated circuit comprising:
a differential output driver circuit comprising an output transistor comprising a first transistor group comprising a first number of legs and first control electrodes, a second transistor group comprising a second number of legs and second control electrodes, and a third transistor group comprising a third number of legs and third control electrodes, wherein the first number of legs is greater than the second number of legs, which is greater than the third number of legs;
a first predriver coupled to the first control electrodes;
a second predriver coupled to the second control electrodes; and
a third predriver coupled to the third control electrodes, wherein at least one of the first, second, or third predriver are enabled to drive the differential output driver.

18. The integrated circuit of claim 17 further comprising:
a control circuit to enable, at least one of the first, second, or third predriver based on a configuration of plurality of slew rate control bits.

19. The integrated circuit of claim 17 wherein the first predriver provides a output signal to the first control electrodes having a first edge rate or a second edge rate, wherein the first edge rate is faster than the second edge rate.

* * * * *